June 4, 1957 A. R. F. PLUMMER 2,794,899

APPARATUS FOR AND METHOD OF FORMING P-N JUNCTION DEVICES

Filed April 20, 1955

United States Patent Office 2,794,899

Patented June 4, 1957

2,794,899

APPARATUS FOR AND METHOD OF FORMING P-N JUNCTION DEVICES

Alexander R. F. Plummer, Wembley, England, assignor, by mesne assignments, to The General Electric Company Limited, Wembley, England Application April 20, 1955, Serial No. 502,641

Claims priority, application Great Britain May 3, 1954

13 Claims. (Cl. 219—85)

*General*

Figure 1:
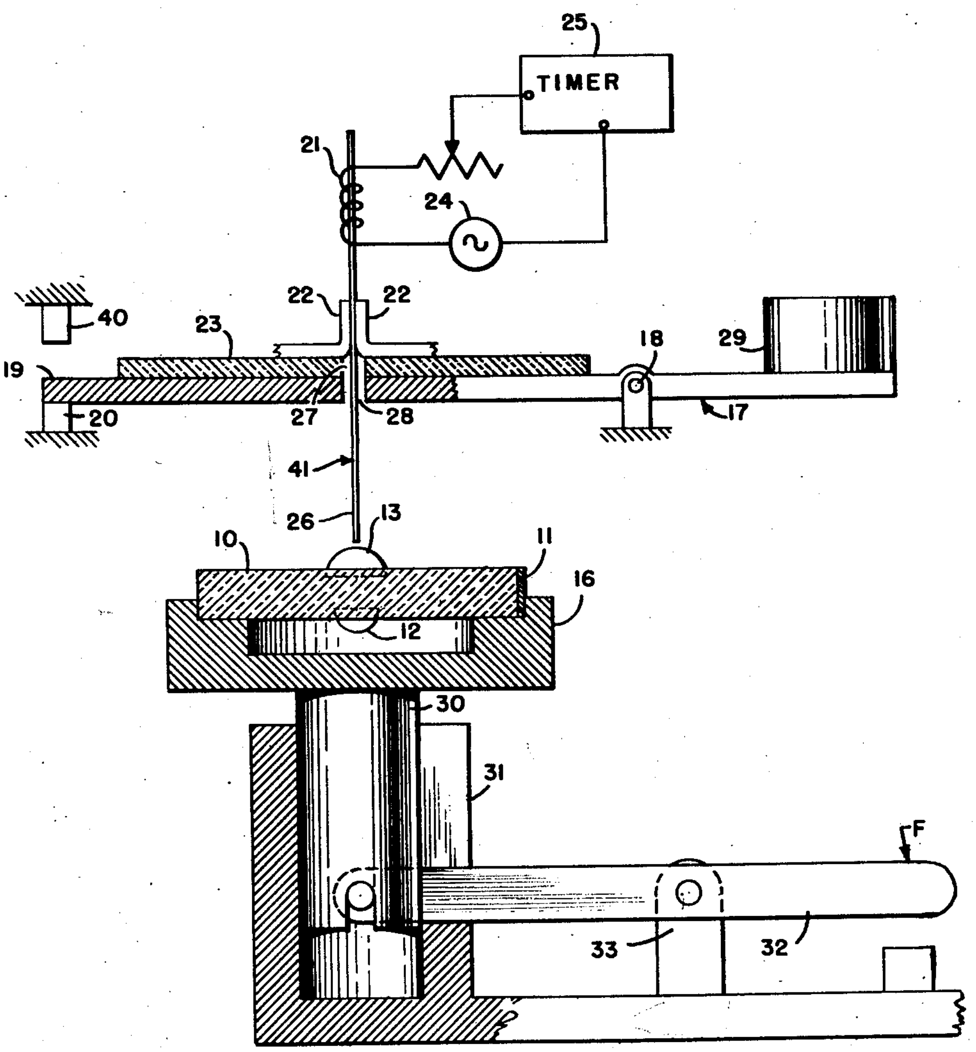

This invention relates to the method of bonding a wire to a fused bead of a material which forms a P–N junction with a body of semiconductive material of a predetermined conductivity type. More particularly, the invention is directed to apparatus for and the method of forming P–N junction devices.

The invention is concerned in particular with semiconductor devices of the kind comprising an electrode formed by heating on the surface of a semiconductor body of one conductivity type a small quantity of a material consisting of or containing an impurity corresponding to the opposite conductivity type and then cooling the material so as to form a bead at the base of which is a P–N junction. Such junctions are sometimes referred to in the art as fused junctions. In this specification an electrode of the type mentioned above will be referred to as a bead electrode.

In the manufacture of semiconductor devices of this kind, it is usually necessary to secure a conducting lead to the bead and this may be done, for example, by soldering a wire to the bead by melting part of the bead. If this method is adopted, it is necessary, in view of the small size of the bead, to exercise some care to avoid fusing the whole bead since, if this occurs, there is a danger that the P–N junction will be short-circuited.

It is an object of the present invention, therefore, to provide a new and improved method of forming a P–N junction device in which the danger referred to above is considerably diminished.

It is another object of the invention to provide a new and improved method of bonding a wire to a fused bead of a material which forms a P–N junction with a body of semiconductive material of a predetermined conductivity type.

It is a further object of the invention to provide a new and improved apparatus for forming a P–N junction device.

In accordance with the invention, the method of bonding a wire to a fused bead of material which forms a P–N junction with a body of semiconductive material of a predetermined conductivity type comprises placing an end of the wire in contact with a surface of the bead and applying heat to a portion of the wire spaced from the aforesaid end while maintaining that end thermally shielded from the aforesaid portion except by conduction through the wire so that only a portion of the bead adjacent the aforesaid end is melted. The method further comprises pressing the aforesaid end into the melted portion until it is immersed therein and cooling the melted portion and the immersed end, whereby the wire is bonded to the bead upon solidification thereof.

Also in accordance with the invention, apparatus for forming a P–N junction device comprises a support for a P–N junction that includes on a body of semiconductive material a fused bead which is capable of inducing current conduction in that body, means for supporting a wire with one end thereof above the bead, and means for applying heat to a portion of the wire spaced from the aforesaid end. The apparatus also includes means for thermally shielding the aforesaid end from the aforesaid one portion except by conduction through the wire and means for providing relative movement between the support and the supporting means to bring the heated end into engagement with a surface of the bead to melt a portion of the bead adjacent the aforesaid end and to press that end into that melted portion until it is immersed therein. The apparatus additionally comprises means for removing the heat from the aforesaid portion of the wire to permit the melted portion and the end of the wire to cool, whereby the wire is bonded to the bead upon solidification thereof.

For a better understanding of the present invention, together with other and further objects thereof, reference is had to the following description taken in connection with the accompanying drawing, and its scope will be pointed out in the appended claims.

Figure 2:
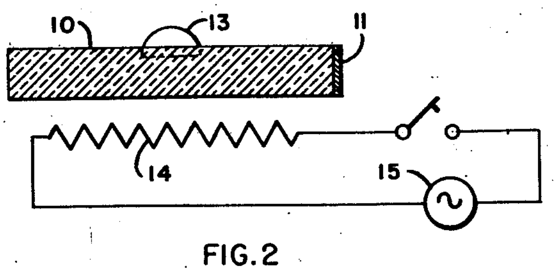

Referring to the drawing:

Fig. 1 is a diagrammatic representation of apparatus for performing one step in the method of forming a P–N junction device, and Fig. 2 is a similar representation of apparatus which may be employed in the method of bonding a wire to a fused bead of a material that forms a P–N junction with a body of semiconductive material of a predetermined conductivity type.

*Description of apparatus for and method of forming a P–N junction device*

One arrangement in accordance with the invention will now be described by way of example with reference to the manufacture of a germanium crystal triode although the arrangement may be used in the manufacture of crystal diodes, tetrodes, etc.

The crystal triode is manufactured from a plate or body 10 of N-type germanium, such as that represented in Fig. 1, having a thickness if about 0.2 millimeter and having main faces about 3 millimeters square; the plate has secured to it a metallic lead or coating 11 which constitutes the base connection of the crystal triode. During the manufacture of the crystal triode, two bead electrodes, such as those represented in Fig. 2, are formed on opposite main faces of the plate, the bead electrodes being aligned with each other and respectively constituting the emitter and collector electrodes 12 and 13 of the crystal triode. Each bead electrode is formed by placing a small quantity of indium in contact with the appropriate main face of the plate, as shown in Fig. 2, heating the plate to a temperature of about 500° C. by a suitable means such as the heating element 14 energized from a source 15 and then allowing the plate to cool; by this means there is produced in each case an indium bead at the base of which is formed a layer of P-type germanium which is separated from the main body of the N-type germanium by a P–N junction. The quantities of indium used are such that the emitter bead electrode when formed has a diameter of about 0.4 millimeter while the collector bead electrode has a diameter of about 1.1 millimeters.

Each bead electrode is then provided with a conducting lead in the following manner. The germanium plate 10 is mounted in a holder or support 16 with the appropriate bead electrode uppermost, the holder being disposed below the end of an arm 17 which is pivoted at 18 about a horizontal axis and is free to rotate under the influence of gravity in such a sense that the end 19 of the arm below which the holder is disposed tends to move downwards, a stop 20 being provided for limiting the rotation of the arm when it is disposed with its axis horizontal. Upward movement of the arm 17 is limited by a stop 40. At the end 19 of the arm 17 is mounted an electric resistance heater coil 21, and a tinned copper wire 41 having a diameter of 0.18 millimeter is supported by suitable gripping means 22, 22 on the arm so as to be disposed along the axis of the heater coil. Below the heater coil 21 is disposed a shield 23 of a suitable heat-insulating material for shielding the bead electrode, such as electrode 13, from the radiation from the heater coil when the latter is energized from a source 24 controlled by a suitable timer 25. The end 26 of the wire 41 is arranged to project slightly below the shield through a hole 27 in the shield and a corresponding hole 28 in the arm 17.

A counterweight 29 mounted on one end of arm 17 tends to counterbalance the gripping means 22, 22, the shield 23, the coil 21, and any other elements supported by the other end of arm 17. A rod 30, slidably mounted in a guideway 31, is pivotally attached to the support 16 and a lever arm 32 is pivotally attached to the rod 30 and to a support 33 so that the application of a force F to the free end of the lever arm serves to elevate the support.

*Operation of apparatus of Fig. 2 and explanation of forming method*

After the germanium plate 10 and the wire have been mounted in position, the holder 16 carrying the germanium plate is moved vertically upwards by the application of a force F to lever arm 32 so that the lower end 26 of the wire 41 comes into contact with the central portion of the surface of the bead 13. The upward movement of the holder 16 is continued and this lifts the end 19 of the arm 17 on which the wire 41 is mounted a predetermined distance established by the stop 40 above the position which it occupies when the arm is in contact with the lower stop 20. The heater coil 21 is then energized by turning on the timer 25 so as to heat the lower end of the wire by conduction and the temperature to which the wire is heated is arranged to be such that a small part of the bead 13 in the vicinity of the end of the wire is melted. It will be appreciated that, since the bead 13 is shielded from direct radiation from the heater coil 21 by the shield 23, the amount of the bead which is melted may be closely controlled by controlling the current flowing through the coil and the time for which it flows so that there is little danger of the whole bead being melted. By virtue of its weight, the arm 17 then rotates counterclockwise about its pivot 18 so that the lower end of the wire becomes immersed in the molten material, the penetration of the wire into the bead being determined by the end 19 of the arm coming into contact once more with the stop 20. The supply of energy to the heater coil is then switched off by the action of the timer 25 so that the wire 41 and bead 13 cool and the molten material is resolidified, thus securing the wire firmly to the bead.

It will be appreciated that various modifications are possible in the method described above. For example, it would be possible to arrange for wires to be secured to the two beads simultaneously. It would also be possible to provide a continuous supply of wire to form the leads for the electrodes of a series of devices, the wire being severed near its end after attachment to each bead.

It will be further appreciated that the invention is not restricted to cases where the bead is formed by using indium. For example, where the semiconductor body is of P-type germanium, the bead may be formed by using a small quantity of an alloy of antimony and lead.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. The method of bonding a wire to a fused bead of material which forms a P–N junction with a body of semiconductive material of a predetermined conductivity type comprising: placing an end of said wire in contact with the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

2. The method of bonding a wire to a fused bead of material which forms a P–N junction with a body of semiconductive material of a predetermined conductivity type comprising: placing an end of said wire in contact with the central portion of the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

3. The method of bonding a wire to a fused bead of material which forms a P–N junction with a body of semiconductive material of a predetermined conductivity type comprising: placing an end of said wire in contact with the surface of said bead; applying heat for a predetermined time interval to a portion of said wire spaced from said end while maintaining said end thermally shielded from said portion except by conduction through said wire so that only a portion of said bead adjacent said end is melted; pressing said end into said melted portion during at least said interval until it is immersed therein; and cooling said melted portion and said immersed end, whereby said wire is bonded to said bead upon solidification thereof.

4. The method of bonding a wire to a fused bead of material which forms a P–N junction with a body of semiconductive material of a predetermined conductivity type comprising: placing an end of said wire in contact with the surface of said bead; electrically heating a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

5. The method of bonding a wire to a fused bead of material which forms a P–N junction with a body of semiconductive material of a predetermined conductivity type comprising: placing the lower end of said wire in contact with the surface of said bead; applying heat to a portion of said wire spaced above said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

6. The method of bonding a wire to a fused bead of indium which has a diameter within the range of 0.4 to 1.1 millimeters and forms a P–N junction with a body of N-type germanium comprising: placing an end of said wire in contact with the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

7. The method of bonding a wire to a fused bead of indium which has a diameter within the range of 0.4 to 1.1 millimeters and forms a P–N junction with a body of N-type germanium having a thickness of about 0.2 millimeter and main faces about 3 millimeters square comprising: placing an end of said wire in contact with the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end in air, whereby said wire is bonded to said bead upon solidification thereof.

8. The method of bonding a wire to a fused bead of an alloy of antimony and lead which has a diameter within the range of 0.4 to 1.1 millimeters and forms a P–N junction with a body of P-type germanium comprising: placing an end of said wire in contact with the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

9. The method of bonding a wire to a fused bead of an alloy of antimony and lead which has a diameter within the range of 0.4 to 1.1 millimeters and forms a P–N junction with a body of P-type germanium having a thickness of about 0.2 millimeter and main faces of about 3 millimeters square comprising: placing an end of said wire in contact with the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

10. The method of bonding a wire to a fused bead of material which forms a P–N junction with a body of semiconductive material of a predetermined conductivity type comprising: placing an end of said wire in contact with the surface of said bead; applying a controlled current for a predetermined time interval to an electrical heating coil surrounding a portion of said wire spaced from said end while maintaining said end thermally shielded from said portion except by conduction through said wire so that only a portion of said bead adjacent said end is melted; pressing said end into said melted portion during at least said interval until it is immersed therein; and cooling said melted portion and said immersed end, whereby said wire is bonded to said bead upon solidification thereof.

11. The method of bonding a tinned copper wire having a diameter of about 0.18 millimeter to a fused bead of material which has a diameter within the range of 0.4 to 1.1 millimeters and forms a P–N junction with a body of semiconductive material of a predetermined conductivity type having a thickness of about 0.2 millimeter and main faces about 3 millimeters square comprising: placing an end of said wire in contact with the surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

12. The method of forming a P–N junction device comprising: heating to fusion on a body of semi-conductive material of a predetermined conductivity type a quantity of material sufficient to produce a bead which upon solidification is capable of inducing current conduction in said body; cooling said bead to solidification; placing an end of said wire in contact wth a surface of said bead; applying heat to a portion of said wire spaced from said end while maintaining said end thermally shielded from said portion except by conduction through said wire so that only a portion of said bead adjacent said end is melted; pressing said end into said melted portion until it is immersed therein; and cooling said melted portion and said immersed end, whereby said wire is bonded to said bead upon solidification thereof.

13. Apparatus for forming a P–N junction device comprising: a support for a P–N junction that includes on a body of semiconductive material a fused bead which is capable of inducing current conduction in said body; means for supporting a wire with one end thereof above the fused bead; means for applying heat to a portion of said wire spaced from said end; means for thermally shielding said end from said one portion except by conduction through said wire; means for providing relative movement between said support and said supporting means to bring said heated end into engagement with a surface of said bead to melt a portion of said bead adjacent said end and to press said end into said melted portion until it is immersed therein; and means for removing said heat from said portion of said wire to permit said melted portion and said end to cool, whereby said wire is bonded to said bead upon solidification thereof.

References Cited in the file of this patent

UNITED STATES PATENTS

| | | |
|---|---|---|
| 2,316,597 | Kershaw | Apr. 13, 1943 |
| 2,725,505 | Webster et al. | Nov. 29, 1955 |